(12) United States Patent
Grace et al.

(10) Patent No.: US 6,893,939 B1
(45) Date of Patent: *May 17, 2005

(54) THERMAL PHYSICAL VAPOR DEPOSITION SOURCE WITH MINIMIZED INTERNAL CONDENSATION EFFECTS

(75) Inventors: Jeremy M. Grace, Penfield, NY (US); Dennis R. Freeman, Spencerport, NY (US); Justin H. Klug, Boston, MA (US); Neil P. Redden, Sodus Point, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/786,859

(22) Filed: Feb. 25, 2004

(51) Int. Cl.⁷ .............................................. H01L 21/76
(52) U.S. Cl. ...................................... 438/424; 118/726
(58) Field of Search .......................................... 438/424

(56) References Cited

U.S. PATENT DOCUMENTS

| | | | |
|---|---|---|---|
| 4,356,429 A | 10/1982 | Tang | |
| 4,539,507 A | 9/1985 | VanSlyke et al. | |
| 4,720,432 A | 1/1988 | VanSlyke et al. | |
| 4,769,292 A | 9/1988 | Tang et al. | |
| 5,550,066 A | 8/1996 | Tang et al. | |
| 6,237,529 B1 * | 5/2001 | Spahn | 118/726 |
| 6,337,102 B1 | 1/2002 | Forrest et al. | |
| 6,749,906 B2 * | 6/2004 | Van Slyke | 427/591 |
| 2003/0101937 A1 * | 6/2003 | Van Slyke et al. | 118/726 |
| 2003/0168013 A1 | 9/2003 | Freeman et al. | |
| 2004/0144321 A1 * | 7/2004 | Grace et al. | 118/726 |

* cited by examiner

Primary Examiner—David Nelms
Assistant Examiner—Thao P. Le
(74) Attorney, Agent, or Firm—Raymond L. Owens

(57) ABSTRACT

A thermal physical vapor deposition source for depositing material onto a substrate includes an elongated container for receiving the material, the container having a conductance $C_B$ in the elongated direction, and a heater for heating the material in the container to vaporize the material to a partial pressure $P_m$. The container has at least one member defining a plurality of apertures arranged along the length of the member, the apertures having a total conductance $C_A$, wherein $$\frac{C_A}{C_B} \leq 0.5;$$

and end heaters for heating each side of the container to reduce condensation of material onto the container.

45 Claims, 6 Drawing Sheets

THERMAL PHYSICAL VAPOR DEPOSITION SOURCE WITH MINIMIZED INTERNAL CONDENSATION EFFECTS

CROSS REFERENCE TO RELATED APPLICATIONS

Reference is made to commonly assigned U.S. patent application Ser. No. 10/352,558 filed Jan. 28, 2003 by Jeremy M. Grace et al., entitled "Method of Designing a Thermal Physical Vapor Deposition System", the disclosure of which is herein incorporated by reference.

FIELD OF THE INVENTION

The present invention relates to an improved way of vapor deposition of material onto a substrate that has improved uniformity.

BACKGROUND OF THE INVENTION

An organic light-emitting device, also referred to as an organic electroluminescent device, can be constructed by sandwiching two or more organic layers between first and second electrodes.

In a passive matrix organic light-emitting device (OLED) of conventional construction, a plurality of laterally spaced light-transmissive anodes, for example indium-tin-oxide (ITO) anodes, are formed as first electrodes on a light-transmissive substrate such as, for example, a glass substrate. Two or more organic layers are then formed successively by vapor deposition of respective organic materials from respective sources, within a chamber held at reduced pressure, typically less than $10^{-3}$ Torr ($1.33 \times 10^{-1}$ Pa). In addition to doped or undoped organic light-emitting material, typical organic layers used in making OLEDS are doped or undoped organic hole-injecting material, doped or undoped organic hole-transporting material, and doped or undoped organic electron-transporting material, where doping refers to adding a minor constituent to enhance the electrical performance, optical performance, stability, or lifetime of a given material or device constructed thereof. A plurality of laterally spaced cathodes is deposited as second electrodes over an uppermost one of the organic layers. The cathodes are oriented at an angle, typically at a right angle, with respect to the anodes.

Applying an electrical potential (also referred to as a drive voltage) operates such conventional passive matrix organic light-emitting devices between appropriate columns (anodes) and, sequentially, each row (cathode). When a cathode is biased negatively with respect to an anode, light is emitted from a pixel defined by an overlap area of the cathode and the anode, and emitted light reaches an observer through the anode and the substrate.

In an active matrix organic light-emitting device (OLED), an array of anodes is provided as first electrodes by thin-film transistors (TFTs), which are connected to a respective light-transmissive portion. Two or more organic layers are formed successively by vapor deposition in a manner substantially equivalent to the construction of the aforementioned passive matrix device. A common cathode is deposited as a second electrode over an uppermost one of the organic layers. The construction and function of an active matrix organic light-emitting device is described in U.S. Pat. No. 5,550,066, the disclosure of which is herein incorporated by reference.

Organic materials, thicknesses of vapor-deposited organic layers, and layer configurations, useful in constructing an organic light-emitting device, are described, for example, in U.S. Pat. Nos. 4,356,429, 4,539,507, 4,720,432, and 4,769,292, the disclosures of which are herein incorporated by reference.

Other kinds of imaging devices such as imaging phosphors for computed radiography and x-ray photoconductive devices for digital radiography depend on the ability to coat the active materials uniformly over large areas.

For sufficiently small substrates, a point source approach can be implemented wherein the material to be deposited emanates from a localized heated crucible and the substrate is placed sufficiently far from the localized region of vaporization that the coating is sufficiently uniform along the substrate. As substrate size increases or working distance decreases, rotary or planetary motion of the substrate relative to the localized source is often required to produce the desired uniformity.

By elongating the vaporization source and providing for translation of source and substrate relative to one another, the desired uniformity can be attained at considerably smaller working distances, and thus considerably higher rates and better materials utilization, if desired. Scaling of such a process to large areas (i.e. substrates greater than 15 cm in at least one dimension) is considerably easier than for point sources.

An elongated source for thermal physical vapor deposition of organic layers onto a structure for making an organic light-emitting device has been disclosed by Robert G. Spahn in commonly assigned U.S. Pat. No. 6,237,529. The source disclosed by Spahn includes a housing, which defines an enclosure for receiving solid organic material, which can be vaporized. The housing is further defined by a top plate, which defines a vapor efflux slit-aperture for permitting vaporized organic materials to pass through the slit onto a surface of a structure. The housing defining the enclosure is connected to the top plate. The source disclosed by Spahn further includes a conductive baffle member attached to the top plate. This baffle member prevents particles of organic material from passing through the slit in the top plate by preventing line-of-sight access from the surface of the solid organic material in the enclosure. Particles can be ejected from the surface of the solid material when an electrical potential is applied to the housing to cause heat to be applied to the solid organic material in the enclosure causing the solid organic material to vaporize. By appropriate size and spacing of the baffle, the vaporized material and any ejected particles must first encounter at least one internal surface inside the source before exiting through the slit.

Improvement over the deposition source disclosed in commonly assigned U.S. Pat. No. 6,237,529 has been accomplished by replacing the slit in the top plate by an array of apertures, as disclosed in commonly assigned U.S. Patent Application Publication 2003/0168013 A1 by Dennis R. Freeman et al. In addition to overcoming nonuniformities associated with the slit geometry, Freeman et al. demonstrate the ability to compensate for end effects (i.e. the finite length of source and the consequent drop in relative deposition rate at the source ends) by varying the spacing between apertures (making them more closely spaced near the ends).

In addition, any nonuniformities in heat generation from the heater or heat absorption by the material to be deposited or distribution of said material within the source can give rise to nonuniformity in deposition along the length of the source. Yet another potential source of nonuniformity is unintended leaks in the source enclosure other than the apertures used to deliver the material vapor. If such leaks exist at the ends of the source, the flow of vapor from center to end of the source can cause pressure gradients within the source, thereby causing nonuniformity in the resultant deposition.

Forrest et al. (U.S. Pat. No. 6,337,102 B1) disclose a method for vaporizing organic materials and organic precursors and delivering them to a reactor vessel wherein the substrate is situated, and delivery of the vapors generated from solids or liquids is accomplished by use of carrier gases. In one embodiment of their invention, Forrest et al. locate the substrates within a suitably large reactor vessel, and the vapors carried thereto mix and react or condense on the substrate. Another embodiment of their invention is directed towards applications involving coating of large area substrates and putting several such deposition processes in serial fashion with one another. For this embodiment, Forrest et al. disclose the use of a gas curtain fed by a gas manifold (defined in the disclosure as "hollow tubes having a line of holes") in order to form a continuous line of depositing material perpendicular to the direction of substrate travel.

The approach to vapor delivery as disclosed by Forrest et al. can be characterized as "remote vaporization" wherein a material is converted to vapor in an apparatus external to the deposition zone and more likely external to the deposition chamber. Organic vapors, alone or in combination with carrier gases, are conveyed into the deposition chamber and ultimately to the substrate surface. Great care must be taken using this approach to avoid unwanted condensation in the delivery lines by use of appropriate heating methods. This problem becomes even more critical when contemplating the use of inorganic materials that vaporize to the desired extent at substantially higher temperatures. Furthermore, the delivery of the vaporized material for coating large areas uniformly requires the use of gas manifolds. No mention of the requirements for such a gas manifold is made by Forrest et al.

As can be appreciated from the disclosure of Forrest et al., one skilled in the art would expect to have difficulty providing uniform films from an elongated source in which the material is vaporized along the length of a deposition source within the deposition zone.

SUMMARY OF THE INVENTION

It has been found, in accordance with the present invention, that one of the reasons there can be nonuniformity in a deposited layer of material using a linear thermal evaporation source is condensation of the evaporant material within the source, particularly on the interior walls at either end, thus leading to vapor flow in the lengthwise direction from the center to either end of the source during the deposition process.

It is an object of the present invention to provide for an improved physical vapor deposition system in which the material is vaporized along the length of a deposition source within the deposition zone that minimizes internal condensation effects and avoids the problems noted above.

The above object is achieved by a thermal physical vapor deposition source for depositing material onto a substrate, comprising:
 a) an elongated container for receiving the material, the container having a conductance $C_B$ in the elongated direction;
 b) a heater for heating the material in the container to vaporize the material to a partial pressure $P_m$;
 c) the container having at least one member defining a plurality of apertures arranged along the length of the member, the apertures having a total conductance $C_A$, wherein $$\frac{C_A}{C_B} \leq 0.5;$$

and
 d) end heating means for heating each side of the container to reduce condensation of material onto the container.

In accordance with the present invention, a vapor deposition of material from an elongated container having apertures can be significantly improved by reducing the internal condensation of such material during vapor deposition. This is accomplished in a number of different arrangements that heat the ends of the container for reducing material condensation.

DETAILED DESCRIPTION OF THE INVENTION

Figure 1:
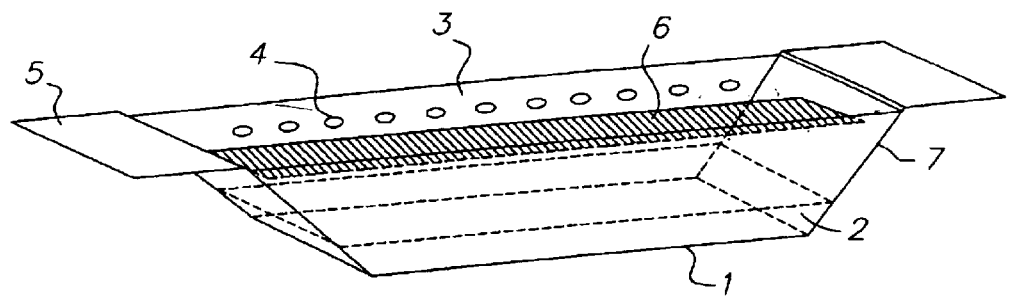
FIG. 1 is a schematic of an elongated vapor deposition source of the present invention having a bottom surface that slopes upward at the ends in order to better heat material in the end regions of the source.

While the discussion below pertains to organic light-emitting devices, it should be readily apparent that the same invention can be applied to the deposition of alkali halide phosphors, amorphous semiconductors, and other luminescent, phosphorescent or photoactive layers, including those which are luminescent by action of ionizing radiation (e.g. x-rays, gamma rays, electrons, or other energetic species having energies sufficient to ionize atoms or molecules), as well as a variety of other materials used in devices based on such luminescent or photoactive layers.

The present invention provides a method of minimizing internal condensation effects by providing an arrangement for heating the ends of the container to reduce condensation of material onto the container.

The design of a linear thermal evaporation source to be robust to nonuniformities in material distribution and heating, as well as leaks that produce vapor flow along the source length, are described in commonly assigned U.S. patent application Ser. No. 10/352,558 filed Jan. 28, 2003 by Jeremy M. Grace et al., entitled "Method of Designing a Thermal Physical Vapor Deposition System", the disclosure of which is herein incorporated by reference. The key design parameter to achieve this robust performance is the conductance ratio, the ratio of total conductance of the apertures $C_A$ to the conductance of the source body or "boat" $C_B$ along its length.

It will be understood that the source body or boat can be the container which directly receives material to be vaporized, or a container in combination with a crucible provided in the container for receiving such material, or any structure for receiving the material in the interior of the source, and distributing the vaporized material to the apertures. $C_B$ represents the net conductance to vapor flow in the long direction of the boat. The conductance $C_A$ refers to the conductance to vapor flow of the apertures.

The vapor flow can be generated from the pressure $P_m$ of the vaporized material to be deposited, or by an additional gas in combination with a partial pressure $P_m$ of vaporized material. The additional gas is preferably an inert gas such as argon, all other noble gases, nitrogen, or other thermally and chemically stable molecular gases. As disclosed in commonly assigned U.S. patent application Ser. No. 10/352, 558 filed Jan. 28, 2003 by Jeremy M. Grace et al., entitled "Method of Designing a Thermal Physical Vapor Deposition System", the disclosure of which is herein incorporated by reference, a low value for the conductance ratio—less than 0.5 and preferably less than 0.1—is essential for minimizing pressure nonuniformity along the length of the boat.

The conductance ratio can be lowered by decreasing aperture size or by increasing the cross sectional dimensions of the source body (the cross sectional dimensions are height and width, where length is defined in the direction along the long axis of the aperture plate). In the former case, the pressure required to generate a given deposition rate will increase as the aperture size decreases, and thus the organic material will need to be heated to higher operating temperatures, which is undesirable for organic materials prone to thermal decomposition. In the latter case, the enlarged cross section presents a large wall area on either end.

The conductance ratio $$\frac{C_A}{C_B}$$

can also be lowered by increasing the pressure, either $P_m$ or including $P_m$ and a partial pressure of inert gas, in the source body such that the transition or viscous flow regime is reached and, thus, the conductance $C_B$ increases with pressure. If the apertures remain in molecular flow or early transition flow at the elevated source body pressure (i.e., the Knudsen number for the apertures remains above or near 1), the conductance ratio will decrease, as $C_B$ will increase proportionately more than $C_A$. Here, Knudsen number K is the ratio of the mean free path of gas molecules to the smallest dimension in the object for which the Knudsen number is being evaluated.

The transition flow regime applies when $0.01 < K < 1$. For $K > 1$, vapor flow is molecular and occurs by molecules colliding with walls and being reemitted therefrom. For $K < 0.01$, viscous flow occurs. In viscous flow, the conductance depends on the ratio of pressure to viscosity and on geometrical factors. For molecules the size of aluminum tris-quinolate (Alq), an aperture having a small dimension of roughly 0.5 mm will exhibit molecular flow for $P_m < 13$ Pa. Above this pressure and for larger aperture dimensions, the flow will progress from transition to viscous flow as $P_m$ or aperture dimension continue to increase.

When the end walls of the container or crucible are significantly cooler than the walls and other surfaces in the central region of the source, there is a tendency for material to condense on said end walls. It has been found that this condensation can drive significant flow of vapor inside the source body, thereby producing a pressure drop from the source center to each end, which then produces nonuniformity in deposition rate along the source length. Evaporant material continues to condense on the ends of the source until the surface of the condensed material can be heated and vaporized to counter the flow of condensing vapor, either through the poor thermal conductivity of the material, or the closer proximity of the material surface to heat sources (i.e. the baffle and aperture plate or a separately powered heater), or both. After this point, the pressure nonuniformity is substantially mitigated, and the uniformity performance improves.

The transient period during which the source uniformity is adversely affected by condensation effects within the source body varies depending on the desired mass flow of vapor from the source, geometrical factors within the source, the details of how heat is supplied to the source, and the conductance ratio. For practical source geometries and rates, the transient period can be many hours and can result in lost manufacturing time and wasted material.

Turning to FIG. 1, a schematic of an elongated vapor deposition source having elongated container 1 with a rectangular cross section is shown. The elongated container 1 is filled with material 2 that can be vaporized (evaporant). A cover or lid 3 seals the source body. In FIG. 1, apertures 4 are located in a row along the central axis of the cover 3. While the apertures are shown in the top surface, which is used to seal the container, the apertures 4 need not be in the top surface, and the sealing surface (i.e., cover or lid) need not be the top surface of the container. The term member, which includes apertures, will be used to encompass any of the above configurations.

The apertures 4 can be in any elongated pattern, including multiple rows, staggered or aligned, and they can be any shape, including circular, rectangular, elliptical, ovular, or square. The container 1 cross section can be other than rectangular shape (for example, circular, elliptical, polygonal). Furthermore, the cover or lid 3 can either seal to the container 1 directly or it can cover an opening in the container 1. Clamps or wires of a variety of kinds, such as tension bands, screwed vise clamps, internal flanges with bolts and tapped holes or external flanges with through holes and nuts, etc. can be used to affix the cover or lid in contact with the container.

The apertures 4 can be arranged with varying size, shape, or spacing to compensate for the loss of deposition rate near the ends of the deposition source, thus improving the uniformity of coating thickness obtained. The size of apertures 4 chosen is such that the total aperture conductance $C_A$ (as can be found by calculation following the formulae provided in John F. O'Hanlon, *A User's Guide to Vacuum Technology*, John Wiley & Sons, New York, 1989, Chapter 3) is $<0.5 \, C_B$, and preferably less than $0.1 \, C_B$, where $C_B$ is the conductance to vapor flow of the boat (container) in its long direction. $C_B$ can be calculated following the formulate provided in John F. O'Hanlon, *A User's Guide to Vaccum Technology*, John Wiley & Sons, New York, 1989, Chapter 3. As described in commonly assigned U.S. patent application Ser. No. 10/352,558 filed Jan. 28, 2003 by Jeremy M. Grace et al., entitled "Method of Designing a Thermal Physical Vapor Deposition System", the disclosure of which is herein incorporated by reference, the operating pressure of the source is determined by the desired mass throughput (determined from the desired coating rate) and the total aperture conductance $C_A$. This operating pressure must be taken into account when calculating conductances $C_A$ and $C_B$.

A baffle 6 prevents particulate matter from being ejected towards the apertures and ensures that vapor exiting the apertures has collided with the internal surfaces of the container so the material flow is well established. The cover or lid or member 3 can be electrically conductive and the body or container electrically insulating, or vice versa, or both can be insulating or conductive. End contacts 5 can be used for mechanical fixture and for making electrical contact to the top surface, when the top surface is used as a resistive heater. Alternatively, electrical feedthroughs (not shown) can be placed through a surface or surfaces of the container to make electrical contact to either the baffle 6 or an additional heater (not shown) internal to the container 1. The surface of the member 3 with apertures 4 can be heated separately from the baffle 6 or with the baffle 6 (or internal heater) in serial or parallel fashion. Alternatively, the source can be radiantly heated by an external source (not shown).

Container sloped end walls 7 (or upward sloping bottom surface at the ends) reduce internal condensation thereon by increasing the view factor to the heat source and thus maintaining higher temperatures near the ends of the source than obtained with vertical end walls. The sloped end walls 7 (or alternatively upwardly sloping bottom surface near the end walls 7) also prevent material from accumulating in regions that would otherwise be significantly cooler than the center portion of the elongated source. The sloped walls 7 can also be implemented on the internal walls of a crucible (not shown) in which the material is held, rather than on the walls of the container 1. In addition, both internal and external walls of the crucible (not shown) can be shaped to accommodate the sloped walls 7 of container 1.

Figure 2:
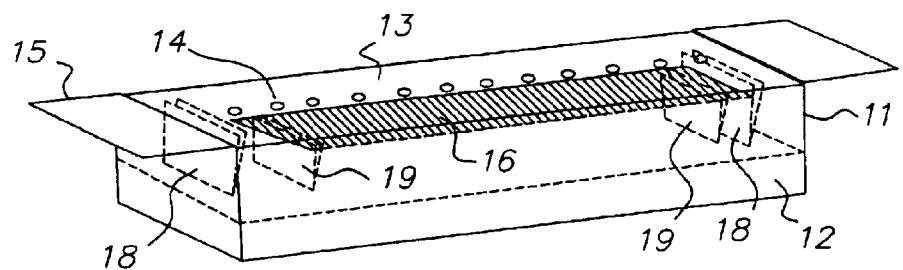
FIG. 2 is a schematic of an elongated vapor deposition source of the present invention having heated extensions protruding downwards at the ends in order to better heat material in the end regions of the source.

Another approach to mitigating internal condensation effects is depicted in FIG. 2, where a schematic of an elongated vapor deposition source having rectangular cross section is shown. As in FIG. 1, a container 11 is filled with evaporant 12. A cover 13 with apertures 14 and end contacts 15 are used to heat the evaporant material. A baffle 16 prevents particulate matter from being ejected towards the apertures and ensures that vapor exiting the apertures has collided with the internal surfaces of the container so the material flow is well established. The various configurations of the above mentioned components, as well as various configurations and techniques for applying heat, are as described for FIG. 1. Aperture 14 and container 11 dimensions are selected in accordance with the conductance criterion as stated above. In addition, two extensions 18 are affixed to the heated member 13 and protrude downward along the vertical end walls so as to radiantly heat the ends of the container 11, thus mitigating the internal condensation effects at the ends of the source. Alternatively, or in addition, extensions 19 are affixed to the baffle 16 so as to radiantly heat the ends of the container 11, thus mitigating the internal condensation effects at the ends of the source.

Figure 3:
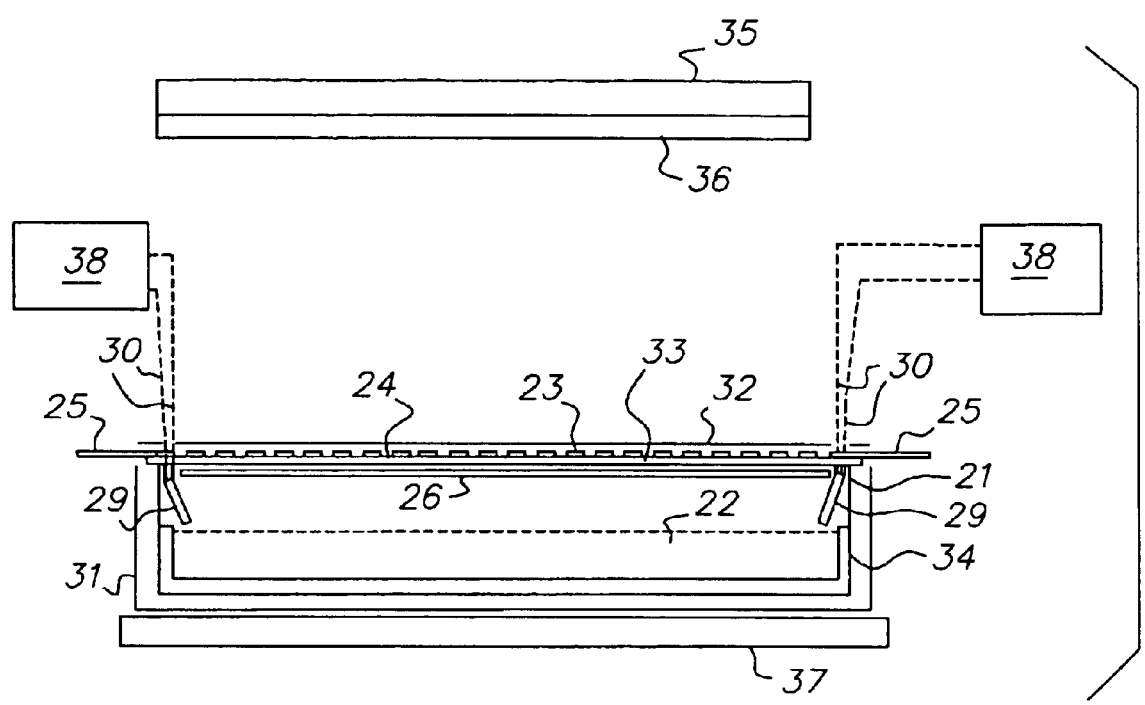
FIG. 3 is a schematic of an elongated vapor deposition source of the present invention having actively heated ends, where the heat is applied separately from heat input to the rest of the source.

The techniques for reducing internal end condensation effects shown in FIGS. 1 and 2 are passive techniques. An active technique for eliminating end condensation effects is shown in FIG. 3, which is a schematic representation in longitudinal cross section of an elongated vapor deposition source. As described in previous figures, the source has a container 21, evaporant 22, heated cover 23, apertures 24, end contacts 25, and baffle 26. Aperture 24 and container 21 dimensions are selected in accordance with the conductance criterion as stated above.

In addition, heating elements 29 are positioned near the ends of the container 21 to provide heat to the vertical end walls. The end heating elements 29 provide a way to heat the ends of the container 21 on each side of the cover or lid 23 a position adjacent to each end aperture 24 to reduce condensation of material onto the container 21, thus preventing internal condensation on the end walls of the container 21. These elements 29 can be shaped to preferentially heat the ends of the container 21 and a crucible 34 therein. Electrical leads 30 are used to drive the end heating elements 29 separately from the heated cover 23. Alternatively, radiative heating of the ends of the source can be achieved by an external source.

In addition, shown in FIG. 3 are a lower radiation shield 31, an upper radiation shield 32, and an insulator plate 33. The radiation shields 31 or 32 and insulator plate 33 can also be implemented with the sources shown in FIGS. 1–2, but are not shown in those drawings. They can be configured so as to permit external radiative heating (not shown) of the ends, or internal heating of the ends as shown in FIG. 3. The upper radiation shield 32 has open area in its top surface to permit evaporant to pass from the source to the substrate. The insulator plate 33 also has open area for this same purpose and serves to isolate the heated cover 23, both thermally and electrically, from the container 21.

In addition there is provided a substrate translation assembly 35, which holds and translates the substrate 36, and a source translation assembly 37, which translates the container 21. The translation assemblies 35 and 37 provide relative motion between the container 21 and the substrate 36. The crucible 34, the substrate translation assembly 35, and the source translation assembly 37 can be implemented with the sources shown in FIGS. 1 and 2. Translation of the substrate 36 and the container 21 can be motor driven worm gears, motor driven lead screws in combination with lead screw followers, magnetically coupled sliding mechanisms, or other arrangements to provide relative motion between substrate 36 and container 21, such that the substrate motion is perpendicular to the elongated axis of the container 21. The way to translate the container 21 or substrate 36 can also include bellows assemblies or nested or telescoping shields to protect the translation mechanisms from accumulation deposited material.

A single power supply 38 or multiple power supplies 38 are used to apply current through the electrical leads 30 to the end heating elements 29. Using the supply 38, the applied current can be adjusted by use of variable transformers, variable resistors, by changing the duty cycle of an alternating waveform (voltage or current), or the like.

EXAMPLES

The invention and its advantages are further illustrated by the following specific examples. In each of these examples there is provided an elongated container for receiving the material, the container having a conductance $C_B$ in the elongated direction. A heater heats the material in the container to vaporize the material to a partial pressure $P_m$. The container has at least one member defining a plurality of apertures arranged along the length of the member, the apertures having a total conductance $C_A$; wherein $$\frac{C_A}{C_B} \leq 0.5.$$

Example 1

No End Heaters

A 50 cm long container made of stainless steel sheet material was covered with an aperture plate/heater assembly. A Grafoil™ gasket was used to seal the cover against the container, and a gasket made of Cogemica™ was used to prevent electrical shorting of the cover to the container. Gaskets, cover, and clamping fixtures had holes around the periphery through which bolts were fastened to the container and tightened to affix the cover to the container.

The aperture plate has 49 apertures with their centers spaced 1 cm over the central 32 cm of the plate. At the ends, the spacings vary as follows. Apertures 1–9 have respective center positions of 0, 6, 12, 19, 26, 34, 42, 51, and 60 mm. Apertures 40–49 have respective center position of 380, 389, 398, 406, 414, 421, 428, 434, and 440 mm. This aperture spacing pattern was chosen to compensate the finite source size effects, which give rise to the loss of deposition rate near the ends of the source. The apertures are rectangular slots 0.0125 cm wide×0.5 cm long.

The 50 cm long container is rectangular in cross section, having a width of 3.3 cm and depth of 4.6 cm. The internal dimensions of the container with aperture assembly affixed are roughly 3.2 cm wide×4.6 cm deep. The container was placed in a stainless steel radiation shield enclosure in a vacuum chamber and high current leads were attached to the aperture plate (cover) at each end (end connections).

The aperture-substrate distance is 12.5 cm. In the substrate plane, an array of eight quartz crystal monitors was placed along the length of the source and directly above the central long axis of the source. The sensor locations were as follows. Sensor 1 was placed directly above aperture 1 (at a height of 12.5 cm, as stated earlier). Sensors 2–8 were then placed along the source axis in respective positions at 6.3, 12.6, 18.9, 25.1, 31.4, 37.7 and 44 cm from sensor 1. Sensors 1 and 8 were used to monitor the drop in output at the source ends from finite source size effects. Sensors 2–7 were used to calculate the nonuniformity [uniformity=(maximum rate−minimum rate)/(maximum rate+minimum rate)] and the average rate (average of the readings of sensors 2–7). As the deposition profile from the elongated vapor source is generally symmetric about the center, the sensor readings were averaged in pairs (2 and 7, 3 and 6, and 4 and 5) to reduce noise associated with sensor operation. Nonuniformity was calculated based on the averages for the three pairs of sensors.

This source operates at a pressure $P_m$ of roughly 6.5 Pa to produce a deposition rate (in the central region) of 50 A/s for aluminum tris-quinolate (Alq) for a source-substrate distance of 12.5 cm. With the aperture sizes indicated, the conductance ratio $C_A/C_B$ is calculated to be <0.4 when the material is loaded 2.6 cm deep, and the deposition rate as described above is 1 A/s and drops to below 0.05 at a rate of 50 A/s. When the material is loaded 1.3 cm deep and the deposition rate as described above is 1 A/s, the conductance ratio is calculated to be <0.2 and drops to below 0.02 at a rate of 50 A/s. The limiting conductance ratios (for negligible amounts of material loaded) are <0.1 at a deposition rate of 1 A/s ($P_m$~0.13 Pa) and <0.01 at 50 A/s ($P_m$~6.5 Pa).

The source was loaded 1.3 cm deep with 200 g aluminum tris-quinolate (Alq) and an aluminum baffle was placed along the source length, suspended from the ends of the source, such that it lies 2.7 mm beneath the aperture plate. The source assembly was placed beneath the quartz crystal monitor array, attached to current leads on either end (by connections to the aperture plate), and the system was pumped to a base pressure$\leq 2 \times 10^{-6}$ mbar.

Heater current was applied along the aperture plate, and the source output was ramped upwards to produce observable deposition rates on the sensor array. Using the heater current to control rate, the average rate was increased from zero to roughly 50 A/s over 8 hours, after which it was reduced to between 4 and 8 A/s and left for 14 hours. The rate was then increased again to roughly 50 A/s over 3 hours and then decreased to 10 A/s over 2 hours, and then reduced to 2 A/s over 4 hours. The source was then left to cool to zero rate.

Figure 4:
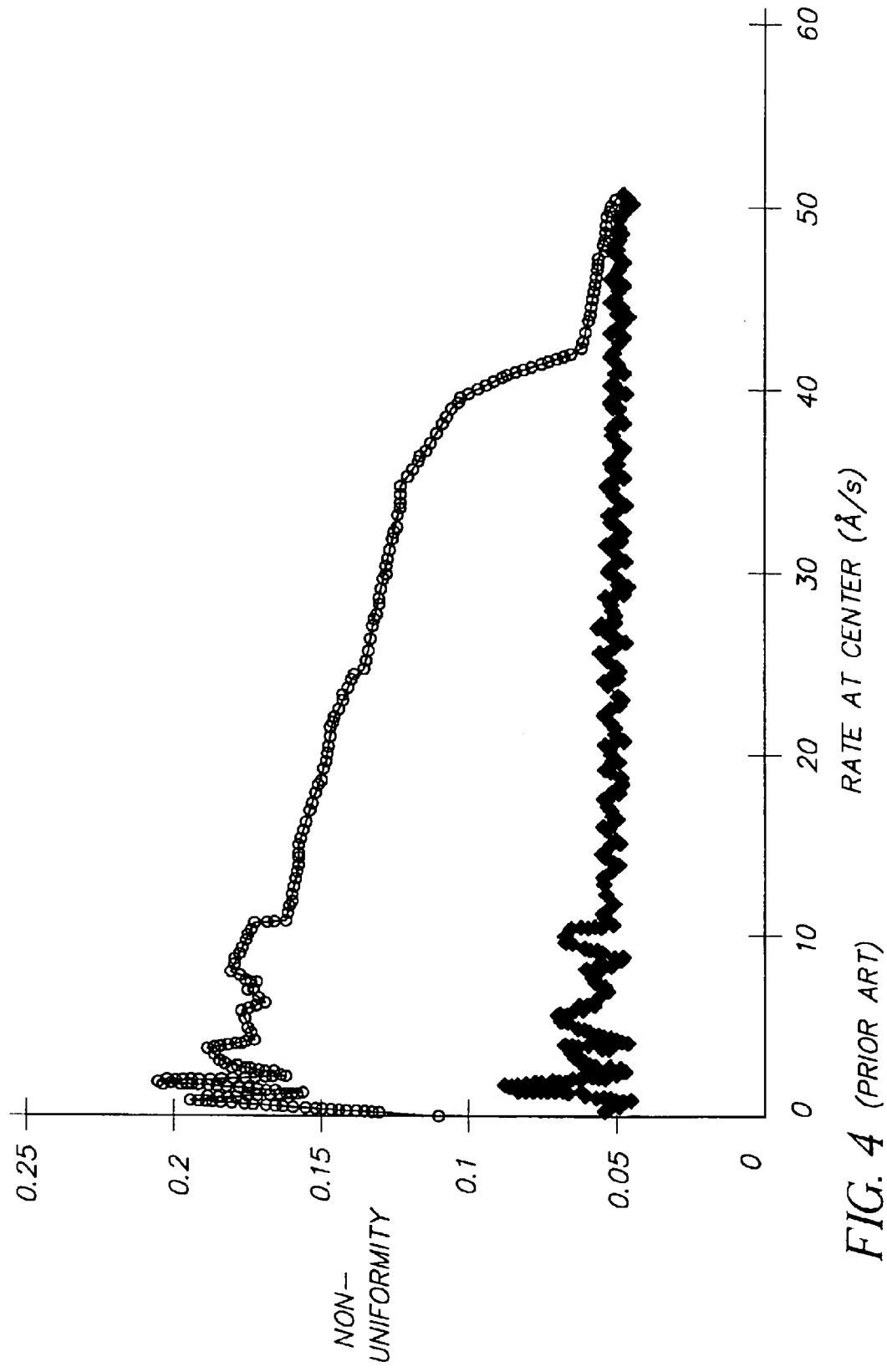
FIG. 4 is a graph of nonuniformity as a function of deposition rate for a source of the prior art, taken as the source was initially heated and after several hours of operation.

Shown in FIG. 4 are the results for initial 8 hour ramp up of rate (open circles o) and the subsequent operation over the next 24 hours (solid diamonds ♦). The nonuniformity is plotted as a function of average rate. As can be seen from FIG. 4, in the early stages of operation, the nonuniformity decreases with increasing rate (and operating time).

The initial decrease in nonuniformity with rate arises from increased source operating pressure and the concomitant increase in internal conductance of the source (as described in commonly assigned U.S. patent application Ser. No. 10/352,558 filed Jan. 28, 2003 by Jeremy M. Grace et al., entitled "Method of Designing a Thermal Physical Vapor Deposition System", the disclosure of which is herein incorporated by reference), which enhances its tolerance to the vapor flow along the length of the source, this flow being driven by internal condensation at the ends of the source. The subsequent sharp drop in nonuniformity at the higher rates (40–50 A/s) is associated with the reduction in vapor flow along the length of the source as the end condensation effects subside. Beyond this point of operation, the vapor flow along the length of the source is reduced to the point where its effects are negligible, and the nonuniformity is roughly 5% over a wide range of deposition rates.

After the source was cooled and left for several hours, it was removed from the chamber and inspected without changing the position of the Alq evaporant material, which had visibly migrated to the periphery of the interior of the source container. The source was then reassembled and placed back into the chamber. Heater current was applied and the source was ramped to 10 A/s output in 3 hours, after which it was left at that rate for 10 hours. The source was then ramped to 50 A/s and back down to 4 A/s over 14 hours. An additional ramp to 50 A/s and back to 10 A/s was performed over 12 hours, and then the rate was reduced to 2 A/s over 2 hours. The source was then shut off and left to cool.

Figure 5:
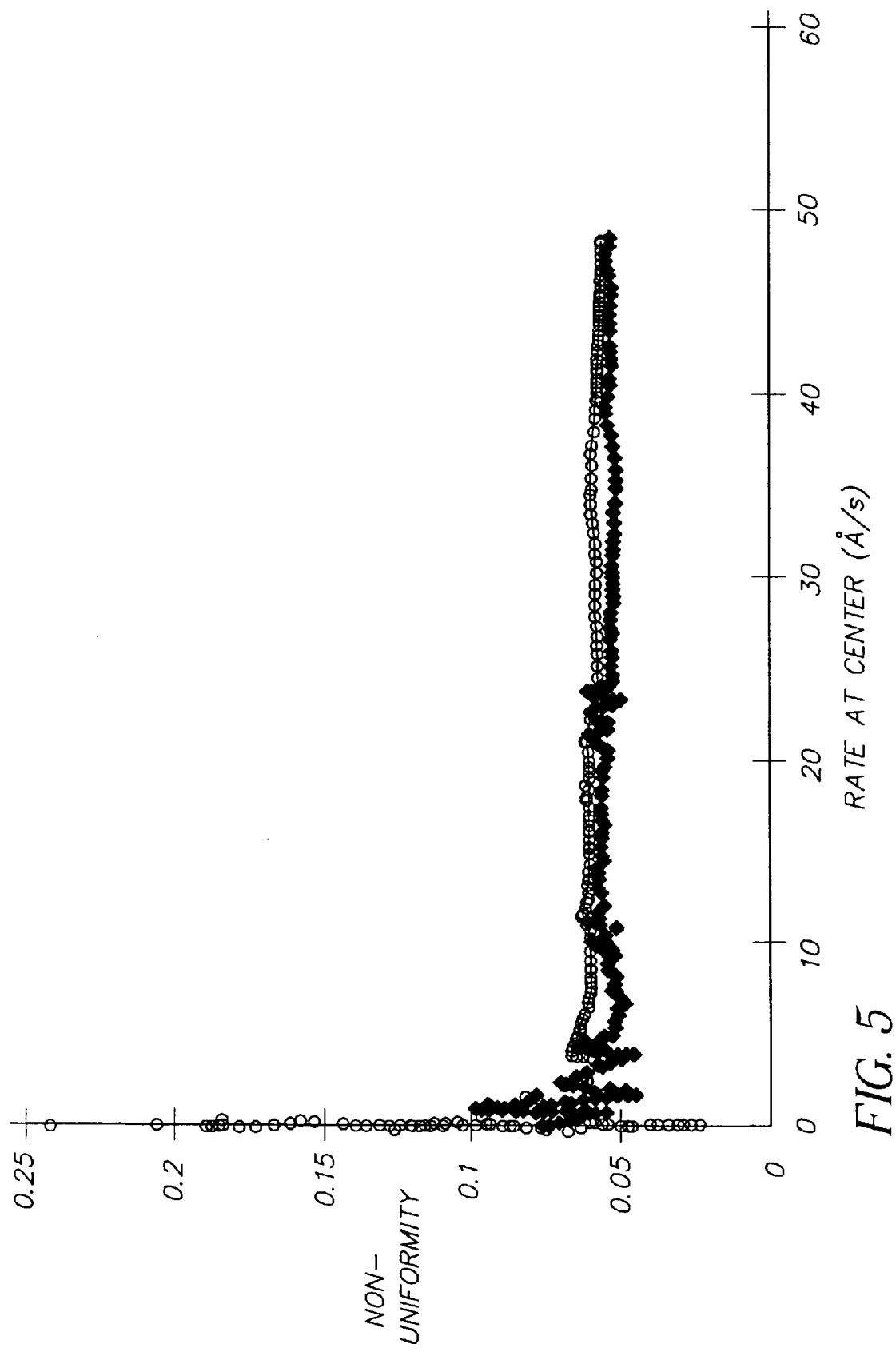
FIG. 5 is a graph of nonuniformity as a function of deposition rate for a source of the prior art, taken after the source had been operated for several hours to obtain the data in FIG. 4 and then had been cooled overnight.

Shown in FIG. 5 are the results for initial ramp up of rate (open circles o) and the subsequent operation over the remainder of the run (solid diamonds ♦) having started with material that had already migrated (from internal condensation effects). As can be seen from FIG. 5, the uniformity is generally independent of operating rate over a wide range of rate and does not exhibit the hysteresis in nonuniformity vs. rate as seen in FIG. 5. This experimental run further substantiates that the nonuniformity hysteresis behavior is a transient phenomenon associated with internal condensation effects as described earlier.

Example 2

The same experimental apparatus of Example 1 above was used with the addition of heating the ends of the container to reduce condensation of material onto the container. The rectangular container in Example 1 was replaced with a container having sloped end walls (as schematically depicted for the container in FIG. 1). The walls were sloped at an angle of approximately 35 degrees from the horizontal. The source was loaded with 200 g Alq and installed in a vacuum chamber beneath the sensor array as described in Example 1. The conductance ratios and operating pressures for given rates were as described in Example 1.

Heater current was applied along the aperture plate, and the source output was ramped upwards to produce observable deposition rates on the sensor array. Using the heater current to control rate, the average rate was increased from zero to roughly 50 A's over 8 hours, after which it was reduced to between 4 and 8 A/s and left for 14 hours. The rate was then increased again to roughly 50 A/s over 2 hours and then decreased to 30 A/s and held at that rate for 12 hours. The rate was then reduced to 10 A/s over 4 hours and then further reduced to 2 A/s and held at that rate for 10 hours. The source was then shut off and left to cool.

Figure 6:
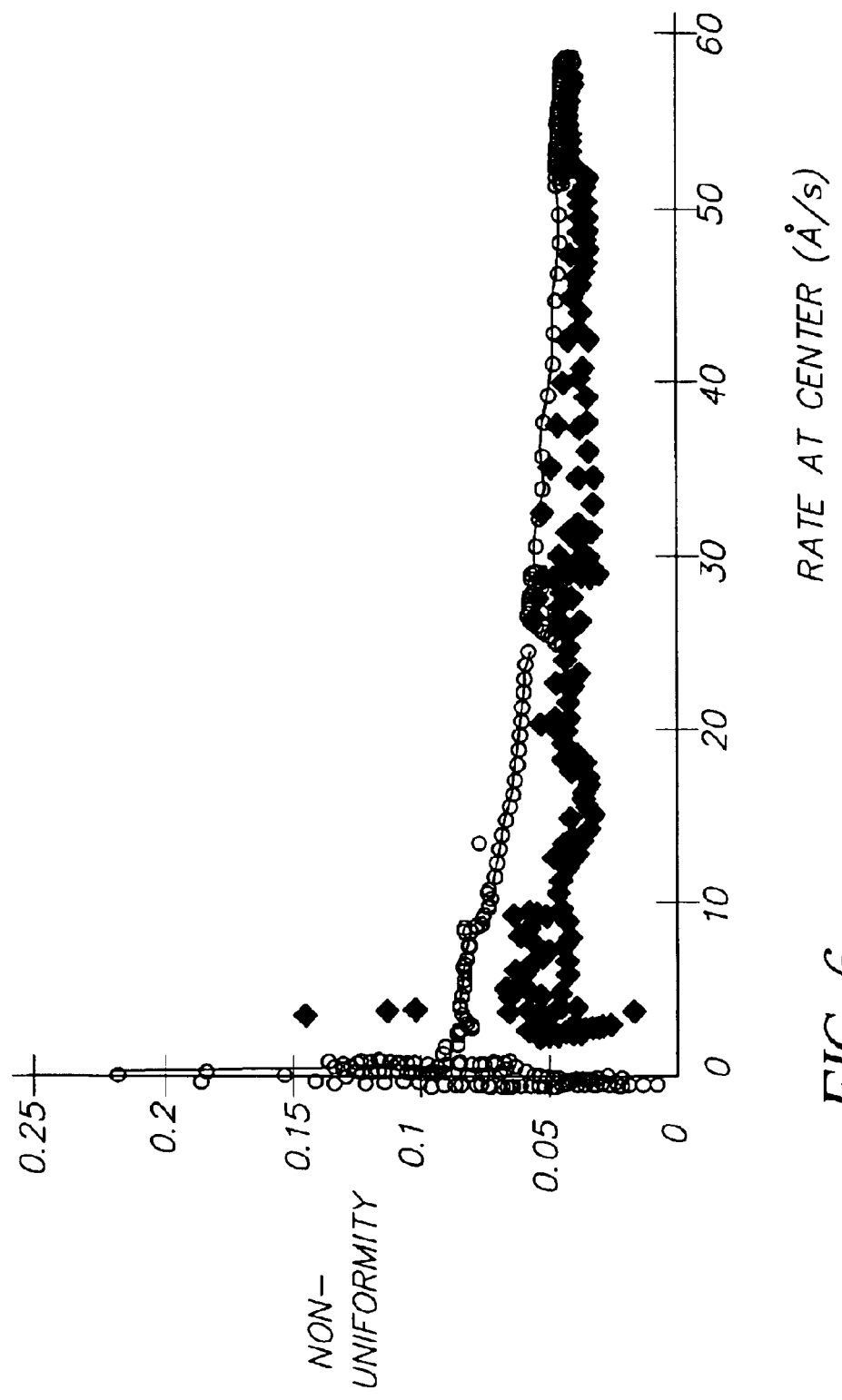
FIG. 6 is a graph of nonuniformity as a function of deposition rate for a source made in accordance with the current invention as illustrated in FIG. 1, taken as the source was initially heated and after several hours of operation.

Shown in FIG. 6 are the results for initial 8 hour ramp up of rate (open circles o) and the subsequent operation over the next 32 hours (solid diamonds ♦). The nonuniformity is plotted as a function of average rate. As can be seen from FIG. 6, the nonuniformity hysteresis is significantly reduced relative to that shown in FIG. 4 for the prior art Example 1.

As in Example 1, the source of Example 2 was removed and inspected without disturbing the distribution of Alq evaporant in the container. It was then reassembled and run in similar fashion to the initial run (8 hours ramp up to 50 A/s, followed by ramps and dwells at lower rates, including a second ramp to 50 A/s, over the next 22 hours and then shut down and let cool over several hours). The nonuniformity as a function of rate for this second run with pre-migrated material was the same as shown in FIG. 5, indicating that the significantly reduced hysteresis behavior shown in FIG. 6 was a transient effect.

Example 3

The same experimental apparatus of Example 1 above was used with the addition of a structure for heating each side of the container to reduce condensation of material onto the container. Sheet metal tabs (extensions 18 in FIG. 2) were spot welded to each end of the aperture plate (cover 13 in FIG. 2). The source was loaded with 200 g Alq and installed in a vacuum chamber beneath the sensor array as described in Example 1. The conductance ratios and operating pressures for given rates were as described in Example 1.

Heater current was applied along the aperture plate, and the source output was ramped upwards to produce observable deposition rates on the sensor array. Using the heater current to control rate, the average rate was increased from zero to roughly 50 A/s over 8 hours, after which it was reduced to between 4 and 8 A/s and left for 14 hours. The rate was then increased again to roughly 50 A/s over ½ hour and held at that rate for 12 hours. The rate was then reduced to 20 A/s over 2 hours and then further reduced to 10 A/s over 2 hours. The source was shut off and left to cool to zero rate.

Figure 7:
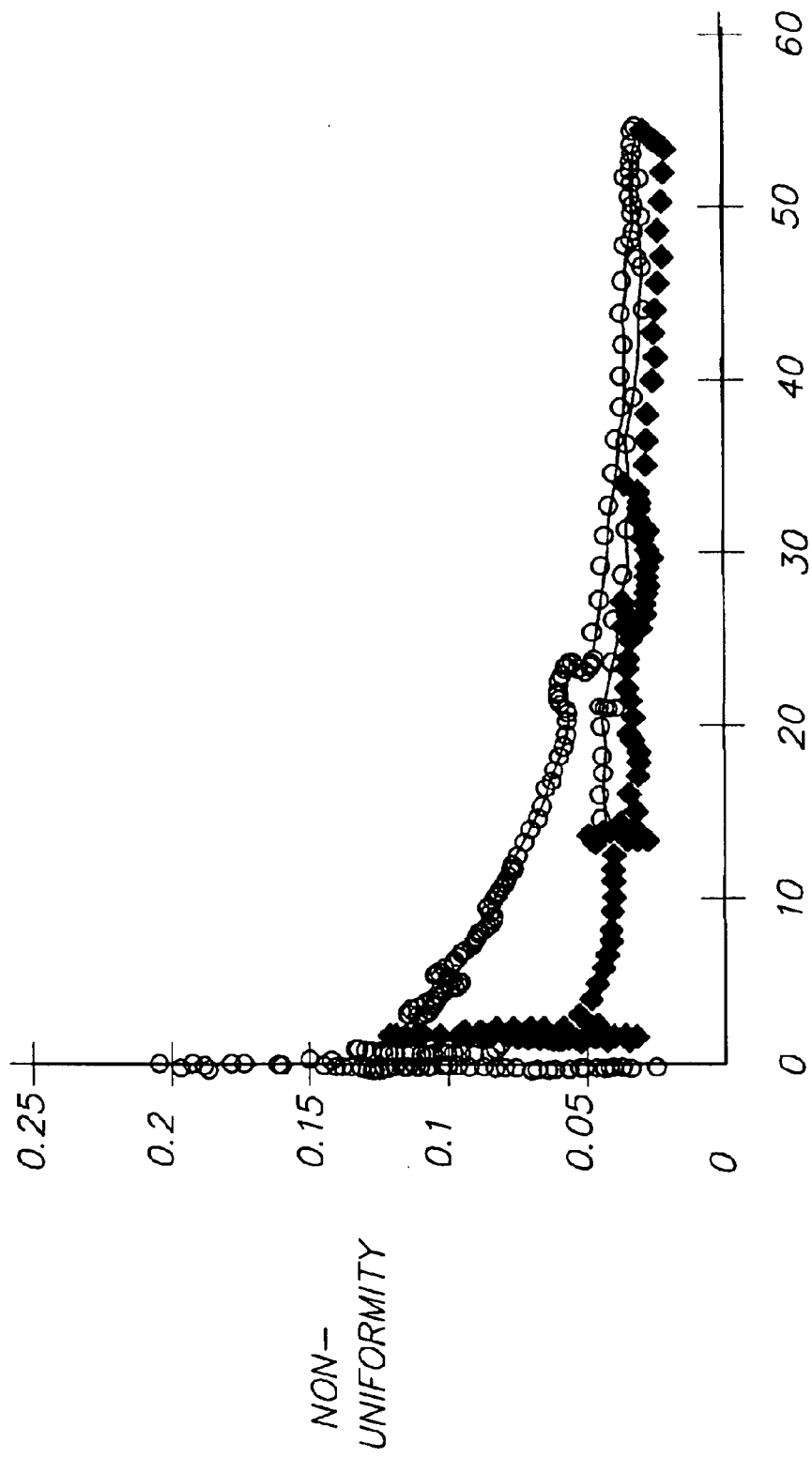
FIG. 7 is a graph of nonuniformity as a function of deposition rate for a source made in accordance with the current invention as illustrated in FIG. 2, taken as the source was initially heated and after several hours of operation.

Shown in FIG. 7 are the results for initial 8 hour ramp up of rate (open circles o) and the subsequent operation over the next 32 hours (solid diamonds ♦). The nonuniformity is plotted as a function of average rate. As can be seen from FIG. 7, the nonuniformity hysteresis is significantly reduced relative to that shown in FIG. 4 for the prior art of Example 1.

As in Example 1, the source of Example 3 was removed and inspected without disturbing the distribution of Alq evaporant in the container. It was then reassembled and run in similar fashion to the initial run (8 hour ramp up to 50 A/s, followed by ramps and dwells at lower rates, including a second ramp to 50 A/s, over the next 22 hours and then shut down and let cool over several hours). The nonuniformity as a function of rate for this second run with pre-migrated material was the same as shown in FIG. 5, indicating that the significantly reduced hysteresis behavior shown in FIG. 7 was a transient effect.

The invention has been described in detail with particular reference to certain preferred embodiments thereof, but it will be understood that variations and modifications can be effected within the spirit and scope of the invention.

| PARTS LIST | |
|---|---|
| 1, 11, 21 | container |
| 2, 12, 22 | material |
| 3, 13, 23 | cover |
| 4, 14, 24 | aperture |
| 5, 15, 25 | end contacts |
| 6, 16, 26 | baffle |
| 7 | sloped end walls (upward sloping bottom surface) |
| 18, 19 | extensions |
| 29 | end heating elements |
| 30 | electrical leads |
| 31 | lower radiation shield |
| 32 | upper radiation shield |
| 33 | insulator plate |
| 34 | crucible |
| 35 | substrate translation assembly |
| 36 | substrate |
| 37 | source translation assembly |
| 38 | power supply |

What is claimed is:

1. A thermal physical vapor deposition source for depositing material onto a substrate, comprising:
   a) an elongated container for receiving the material, the container having a conductance $C_B$ in the elongated direction;
   b) a heater for heating the material in the container to vaporize the material to a partial pressure $P_m$;
   c) the container having at least one member defining a plurality of apertures arranged along the length of the member, the apertures having a total conductance $C_A$, wherein $$\frac{C_A}{C_B} \leq 0.5;$$

and
   d) end heating means for heating each side of the container to reduce condensation of material onto the container.

2. The source of claim 1 wherein the end heating means is conductive and has a resistance and further includes means for applying current therethrough.

3. The source of claim 2 wherein the current applying means is adjustable.

4. The source of claim 1 wherein the end heating means includes separate heating elements disposed adjacent to each end of the container.

5. The source of claim 1 wherein the container includes sloped end walls or upwardly sloping bottom surfaces near ends of the container.

6. The source of claim 1 wherein the end heating means includes extensions attached to the heater or an internal baffle such that they enhance heat transfer to ends of the container.

7. The source of claim 1 wherein the end heating means is applied externally at ends of the container.

8. The source of claim 1 wherein the emission through the apertures is by molecular flow and $P_m \leq 13$ Pa wherein $P_m$ is the partial pressure of vaporized material.

9. The source of claim 1 wherein the emission through the apertures is by viscous or transition flow and $P_m > 13$ Pa, wherein $P_m$ is the partial pressure of vaporized material.

10. The source of claim 1 further including means for providing relative motion between the container and the substrate.

11. The source of claim 1 further including means for introducing an inert gas into the container to decrease $$\frac{C_A}{C_B}.$$

12. The source of claim 11 wherein the inert gas is argon or nitrogen.

13. The source of claim 1 wherein the material is a phosphorescent material, an electroluminescent material, photoconducting, or luminescent by action of ionizing radiation.

14. A source for thermal physical vapor deposition of material onto a substrate, comprising:
  a) an elongated container having walls defining an area for receiving the material, the container having a conductance $C_B$ in the elongated direction wherein the container has a member defining apertures, and further including a baffle between the apertures and the material to prevent vaporized material from passing through the apertures in the member without first engaging the walls of the container;
  b) one or more heating elements disposed relative to the walls for heating the material in the container to vaporize the material to a partial pressure $P_m$;
  c) the apertures in the member arranged along the length of the member, the apertures having a total conductance $C_A$, wherein $$\frac{C_A}{C_B} \leq 0.5;$$

and
  e) end heating means for heating the ends of the container to reduce condensation of material onto the container.

15. The source of claim 14 wherein the end heating means is conductive and has a resistance and further includes a means for applying current therethrough.

16. The source of claim 15 wherein the current applying means is adjustable.

17. The source of claim 14 wherein the end heating means includes resistive heaters, external end heating, or extensions attached to internal heaters or baffles or both.

18. The source of claim 14 wherein the end heating means are heating elements shaped so as to preferentially heat the end portions of the container to reduce condensation.

19. The source of claim 14 wherein the container includes sloped end walls or upwardly sloping bottom surfaces near ends of the container.

20. The source of claim 14 wherein the emission through the apertures is by molecular flow and $P_m \leq 13$ Pa, wherein $P_m$ is the partial pressure of vaporized material.

21. The source of claim 14 wherein the emission through the apertures is by viscous or transition flow and $P_m > 13$ Pa, wherein $P_m$ is the partial pressure of vaporized material.

22. The source of claim 14 further including means for providing relative motion between the container and the substrate.

23. The source of claim 14 further including means for introducing an inert gas into the container to decrease $$\frac{C_A}{C_B}.$$

24. The source of claim 23 wherein the inert gas is argon or nitrogen.

25. The source of claim 14 wherein the material is a phosphorescent material, an electroluminescent material, photoconducting, or luminescent by action of ionizing radiation.

26. A method for coating a large-area substrate, comprising:
  a) loading a material to be deposited on a workpiece into an elongated container, the container having a conductance $C_B$ in the elongated direction;
  b) heating the material in the container to vaporize the material to a partial pressure $P_m$;
  c) the container defining one or more apertures in an elongated pattern in the elongated direction for emitting the vaporized material through the apertures, the one or more apertures having a conductance $C_A$, wherein $$\frac{C_A}{C_B} \leq 0.5;$$

d) heating each end of the container to reduce condensation of material onto the container; and
  e) providing relative motion between the substrate and elongated container in a direction substantially perpendicular to the elongated direction.

27. The method according to claim 26 wherein $$\frac{C_A}{C_B} \leq 0.1$$

over the range of operation.

28. The method according to claim 26 wherein the apertures have varying size, shape or spacing between adjacent apertures, or combinations thereof, selected to provide a substantially uniform efflux of vaporized material along the elongated direction of the container.

29. The method according to claim 26 wherein the method is used to make an OLED.

30. The method according to claim 26 wherein the material received in the container includes doped or undoped organic hole-injecting material, doped or undoped organic hole-transporting material, doped or undoped organic light-emitting material, or doped or undoped organic electron-transporting material.

31. The method according to claim 26 further comprising the step of introducing an inert gas into the container to decrease $$\frac{C_A}{C_B}.$$

32. The method according to claim 31 wherein the inert gas is argon or nitrogen.

33. The method according to claim 26 wherein the material is a phosphorescent material, an electroluminescent material, photoconducting, or luminescent by action of ionizing radiation.

34. A source for thermal physical vapor deposition of material onto a substrate, comprising:
   a) an elongated container defining an enclosure having a crucible having walls and defining an area for receiving the material, the container having a conductance $C_B$ in the elongated direction wherein the container has a member defining apertures, and further including a baffle between the apertures and the material to prevent vaporized material from passing through the apertures in the member without first engaging the walls of the container;
   b) one or more heating members disposed relative to the walls of the crucible for heating the material to vaporize the material to a partial pressure $P_m$;
   c) the apertures in the member arranged along the length of the member, the apertures having a total conductance $C_A$, wherein $$\frac{C_A}{C_B} \leq 0.5;$$

and
   d) end heating means for heating the ends of the container and crucible to reduce condensation of material onto the container and crucible.

35. The source of claim 34 wherein the end heating means is conductive and has a resistance and further includes a means for applying current therethrough.

36. The source of claim 35 wherein the current applying means is adjustable.

37. The source of claim 34 wherein the end heating means includes resistive heaters, external end heating, or extensions attached to internal heaters or baffles or both.

38. The source of claim 34 wherein the end heating means for heating the ends of the container are heating elements shaped so as to preferentially heat the end portions of the container to reduce condensation.

39. The source of claim 34 wherein the container includes sloped end walls or upwardly sloping bottom surfaces near ends of the container and crucible.

40. The source of claim 34 wherein the emission through the apertures is by molecular flow and $P_m \leq 13$ Pa, wherein $P_m$ is the partial pressure of vaporized material.

41. The source of claim 34 wherein the emission through the apertures is by viscous or transition flow and $P_m > 13$ Pa, wherein $P_m$ is the partial pressure of vaporized material.

42. The source of claim 34 further including means for providing relative motion between the container and the substrate.

43. The source of claim 34 further including means for introducing an inert gas into the container to decrease $$\frac{C_A}{C_B}.$$

44. The source of claim 43 wherein the inert gas is argon or nitrogen.

45. The source of claim 34 wherein the material is a phosphorescent material, an electroluminescent material, photoconducting, or luminescent by action of ionizing radiation.

* * * * *